(12) United States Patent
Diep et al.

(10) Patent No.: US 9,073,298 B2
(45) Date of Patent: Jul. 7, 2015

(54) DISPOSABLE BOND GAP CONTROL STRUCTURES

(71) Applicant: Raytheon Company, Waltham, MA (US)

(72) Inventors: Buu Diep, Murphy, TX (US); Roland Gooch, Dallas, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 13/905,431

(22) Filed: May 30, 2013

(65) Prior Publication Data

US 2013/0255876 A1 Oct. 3, 2013

Related U.S. Application Data

(63) Continuation of application No. 13/031,996, filed on Feb. 22, 2011, now Pat. No. 8,454,789.

(60) Provisional application No. 61/410,429, filed on Nov. 5, 2010.

(51) Int. Cl.
*B32B 37/02* (2006.01)
*B32B 38/10* (2006.01)
(Continued)

(52) U.S. Cl.
CPC .............. *B32B 37/30* (2013.01); *Y10T 156/10* (2015.01); *Y10T 156/1374* (2015.01); *Y10T 156/12* (2015.01); *Y10T 156/1052* (2015.01); *Y10T 156/108* (2015.01); *Y10T 156/1062* (2015.01); *B32B 37/02* (2013.01); *B81C 3/007* (2013.01); *B32B 38/10* (2013.01); *B81C 3/008* (2013.01); *B32B 37/0076* (2013.01);
(Continued)

(58) Field of Classification Search
CPC .............. Y10T 156/10; Y10T 156/108; B81C 1/00269; B81C 3/007; B81C 3/008; B81C 2203/0118; B81C 2203/035; B81C 2203/032; B32B 7/0076; B32B 37/02; B32B 38/10
USPC ................ 156/268, 101, 292, 267, 256, 291; 438/462; 83/870, 875, 880; 427/466
See application file for complete search history.

(56) References Cited

U.S. PATENT DOCUMENTS 5,232,962 A   8/1993   Dershem et al.
6,060,336 A   5/2000   Wan
(Continued)

FOREIGN PATENT DOCUMENTS

JP   08-130376 A   5/1996
JP   2005-526896 A   9/2005
(Continued)

OTHER PUBLICATIONS

U.S. Appl. No. 13/031,996.
(Continued)

*Primary Examiner* — Linda L Gray
(74) *Attorney, Agent, or Firm* — Daly, Crowley, Mofford & Durkee, LLP

(57) ABSTRACT

In certain embodiments, a bond gap control structure (BGCS) is placed outwardly from a substrate. The BGCS is configured to control a geometry of a bond line of a joining material. The joining material is deposited outwardly from the substrate. The substrate is bonded to another substrate with the joining material. The BGCS is at least partially removed from the substrate.

12 Claims, 3 Drawing Sheets

(51) Int. Cl.
  *B32B 37/30* (2006.01)
  *B81C 3/00* (2006.01)
  *B32B 37/00* (2006.01)
  *B81C 1/00* (2006.01)

(52) U.S. Cl.
  CPC ...... *B81C 2203/035* (2013.01); *B81C 1/00269* (2013.01); *B81C 2203/0118* (2013.01); *B81C 2203/032* (2013.01)

(56) References Cited

U.S. PATENT DOCUMENTS

| | | | |
|---|---|---|---|
| 6,740,982 | B2 | 5/2004 | Sauter et al. |
| 6,806,309 | B2 | 10/2004 | Jaeger |
| 7,402,341 | B2 | 7/2008 | Halahmi |
| 8,454,789 | B2 | 6/2013 | Diep et al. |
| 2005/0258516 | A1 | 11/2005 | Hong et al. |
| 2005/0263866 | A1 | 12/2005 | Wan |
| 2008/0308919 | A1 | 12/2008 | Obata et al. |
| 2009/0029500 | A1 | 1/2009 | Wan |
| 2010/0092691 | A1 | 4/2010 | Patel et al. |

FOREIGN PATENT DOCUMENTS

| | | | |
|---|---|---|---|
| JP | 2007-214360 | A | 8/2007 |
| JP | 2009-176955 | A | 8/2009 |

OTHER PUBLICATIONS

Taiwan Patent Application No. 100138073 Official Letter dated Apr. 2, 2014, including English translation and Search Report, 12 pages.
French Application No. 11 59992 Search Report dated Jan. 15, 2015 8 pages.
Application No. 216011 Office Action dated Dec. 2, 2014 with English Translation 13 pages.
Japanese Patent Application No. 2011-232841 Japanese Office Action with English Translation dated Nov. 10, 2014 6 pages.
Israeli Patent Application No. 216011 Office Action dated Nov. 26, 2014 with FA cover letter dated Dec. 16, 2014 and English Translation of what is claimed, 12 pages.
Taiwan (R.O.C.) Patent Application No. 100138073, Amendment as filed on Jun. 25, 2014, including Foreign Associate cover letter dated Jul. 17, 2014 and translation of amended claims, 13 pages.
Taiwan(R.O.C.) Patent Application No. 100138073 Notice of Allowance dated Jan. 30, 2015, including Foreign Associate cover letter dated Feb. 6. 2015 and English translation of Notice of Allowance, 5 pages.
Israeli Patent Application No. 216011 Response to Office Action filed Mar. 5, 2015, Foreign Associate cover letter, translation of claims and citation list, 8 pages.
Japanese Patent Application No. 2011-232841 Japaneses Office Action with English Translation dated Nov. 10, 2014 6 pages.
Israell Patent Application No. 216011 Office Action dated Nov. 26, 2014 with FA cover letter dated Dec. 16, 2014 and English Translation of what is claimed, 12 pages.

DISPOSABLE BOND GAP CONTROL STRUCTURES

CROSS REFERENCED TO RELATED APPLICATION

The present application is a continuation of U.S. patent application Ser. No. 13/031,996 filed on Feb. 22, 2011, entitled DISPOSABLE BOND GAP CONTROL STRUCTURES, which claims priority to U.S. Provisional Application No. 61/410,429, entitled DISPOSABLE BOND GAP CONTROL STRUCTURES, filed Nov. 5, 2010, all of which are hereby incorporated herein by reference in their entirety.

TECHNICAL FIELD

This invention relates generally to the field of circuits and more specifically to disposable bond gap control structures.

BACKGROUND

Semiconductor wafers may be bonded together using a joining material to yield bonded wafers. For example, a device wafer may be bonded to a lid wafer using an adhesive or solder to form a microelectromechanical systems (MEMS) device. Certain applications may require that the joining material form a substantially uniform bond line.

SUMMARY OF THE DISCLOSURE

In accordance with the present invention, disadvantages and problems associated with previous techniques for bonding may be reduced or eliminated. In certain embodiments, a bond gap control structure (BGCS) is placed outwardly from a substrate. The BGCS is configured to control a geometry of a bond line of a joining material. The joining material is deposited outwardly from the substrate. The substrate is bonded to another substrate with the joining material. The BGCS is at least partially removed from the substrate. Certain embodiments of the invention may provide one or more technical advantages. A technical advantage of one embodiment may be that a disposable bond gap control structure (BGCS) is at least partially removed after bonding. Accordingly, the BGCS may be formed from any of a variety of materials, even materials that might cause problems if the BGCS had not been removed. Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

Figure 1:
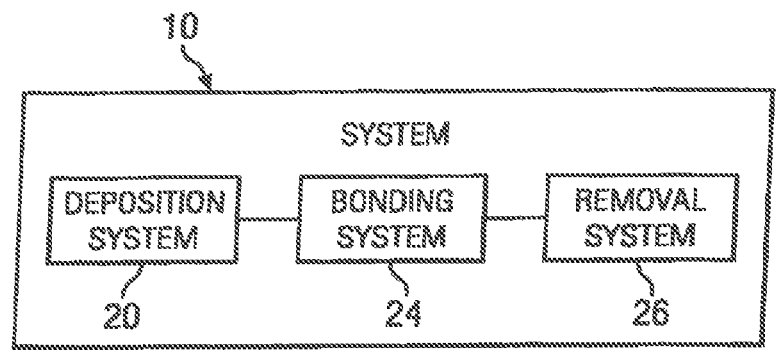
FIG.1 illustrates an example of a system that may use disposable bond gap control structures (BGCSs) to form bonded substrates.

FIG.1 illustrates an example of a system 10 that may use disposable bond gap control structures (BGCSs) to form bonded substrates. In certain situations, substrates such as silicon wafers) may be bonded together using a joining material. After bonding, the joining material forms a bond line in between the substrates. The uniformity of the bond line may be affected by the flatness of the substrates and the bond force used to bond the wafers.

In certain embodiments, system 10 may use BGCSs to control the uniformity of bond lines. A BGCS may operate as a mechanical stop that prevents the joining material from spreading in an undesired manner. In certain embodiments, a BGCS may be disposable, for example, may be disposed of during fabrication. For example, system 10 may at least partially remove the BGCS after bonding. If the BGCS is removed, the BGCS may be formed from a variety of materials, including materials that would cause problems if the BGCS had not been removed. Other BGCSs may remain on the substrate.

In certain embodiments, system 10 may operate on a substrate, such as a wafer. A wafer may comprise semiconductor material, such as silicon, ceramic, or germanium, or other material such as glass. A water may be used in the fabrication of integrated circuits and other microdevices, and may serve as the substrate for microelectronic devices disposed within and outwardly from the wafer. Substrates may have any suitable application, such as microelectromechanical systems (MEMS) or microoptoelectromechanical systems (MOEMS) devices or infrared (IR) detectors.

In the illustrated example, system 10 comprises a deposition system 20, a bonding system 24, and a removal system 26. In the example, deposition system 20 deposits a BGCS and a joining material outwardly from a substrate. The BGCS may control a geometry of a bond line of the joining material. Bonding system 24 bonds the substrate to another substrate with the joining material to yield a bonded structure. Removal system 26 at least partially removes the BGCS from the bonded structure.

In certain embodiments, deposition system 20 deposits any suitable material outwardly from a substrate. For example, deposition system 20 deposits a bond gap control structure (BGCS) and/or a joining material outwardly from a substrate. Deposition system 20 may deposit material in any suitable manner, such as by jetting (using, for example, an inkjet-like print-head or nozzle that physically or electromechanically ejects material), spin-coating, pre-formed material (for example, a die-cut solder preform), physical vapor deposition, plating, screen-printing, photolithography, or other suitable method. Deposition system 20 may use different techniques for different materials. For example, a BGCS may be deposited using one technique (such as jetting) and a joining material (such as solder) may be deposited using another technique (such as a solder preform).

A BGCS may comprise any suitable material. In certain embodiments, the disposability expands the choices of materials because the BGCS may be removed after bonding. A BGCS may comprise a photo-imageable polymer, for example, SU-8 photoresist or bichlorinated butene (BCB). The use of photo-imageable materials may allow for fabrication of a BGCS on lid or device substrates. A BGCS may comprise any suitable organic or inorganic material, for example, as Boron Phosphorous Silicon Glass (BPSG) and tetraethylorthosilicate (TEOS).

A joining material may be solder, adhesive, or other intermediate. Solder may comprise a fusible metal alloy. An adhesive may comprise a mixture that adheres substrates together. Examples of adhesives include heat or UV activated epoxies.

Bonding system 24 may bond substrates in any suitable manner. In certain embodiments, bonding system 24 may align the substrates, one or more of which may have a joining material deposited on it. Bonding system 24 may then apply heat and/or pressure to one or more of the substrates to bond the substrates together.

Removal system 26 may at least partially remove one or more BGCSs in any suitable manner. In certain embodiments, removal system 26 may cut (for example, saw and/or laser cut) substrates, which may at least partially remove a BGCS. In certain embodiments, removal system 26 may use the force of a liquid (such as by water jetting) to at least partially remove a BGCS. In certain embodiments, removal system 26 may chemically remove at least a portion of BGCS (such as by acid etching and/or solvent dissolution).

In certain embodiments, system 10 may include other or additional systems. For example, system 10 may include a printing system that may print a pattern on a substrate and/or a plasma clean system that cleans a substrate prior to bonding.

Figure 2:
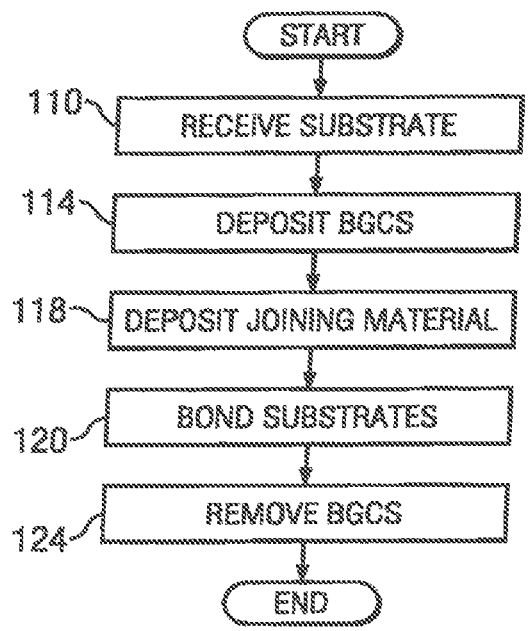
FIG.2 illustrates an example of a method for 10 bonding substrates.

FIG. 2 illustrates an example of a method for bonding substrates that may be performed by system 10. The method starts at step 110, a first substrate is received. One or more BGCSs are deposited outwardly from the first substrate at step 114. In certain embodiments, deposition system 20 deposits (such as jets) BGCSs outwardly from the first substrate. The BGCSs may be placed in BGCS regions. The BGCSs operate to control a geometry of a bond line of a joining material. The joining material is deposited outwardly from the first substrate at step 118. In certain embodiments, deposition system 20 deposits the joining material outwardly from the first substrate.

The first substrate is bonded to a second substrate with the joining material at step 120 to yield a bonded structure. In certain embodiments, bonding system 24 aligns the first and second substrates and then applies heat and/or pressure to the first and/or second substrates to bond the substrates. One or more BGCSs are at least partially removed from the bonded structure at step 124. In certain embodiments, BGCSs are removed as removal system 26 cuts the bonded structure along saw lines. The method then ends.

Figure 3:
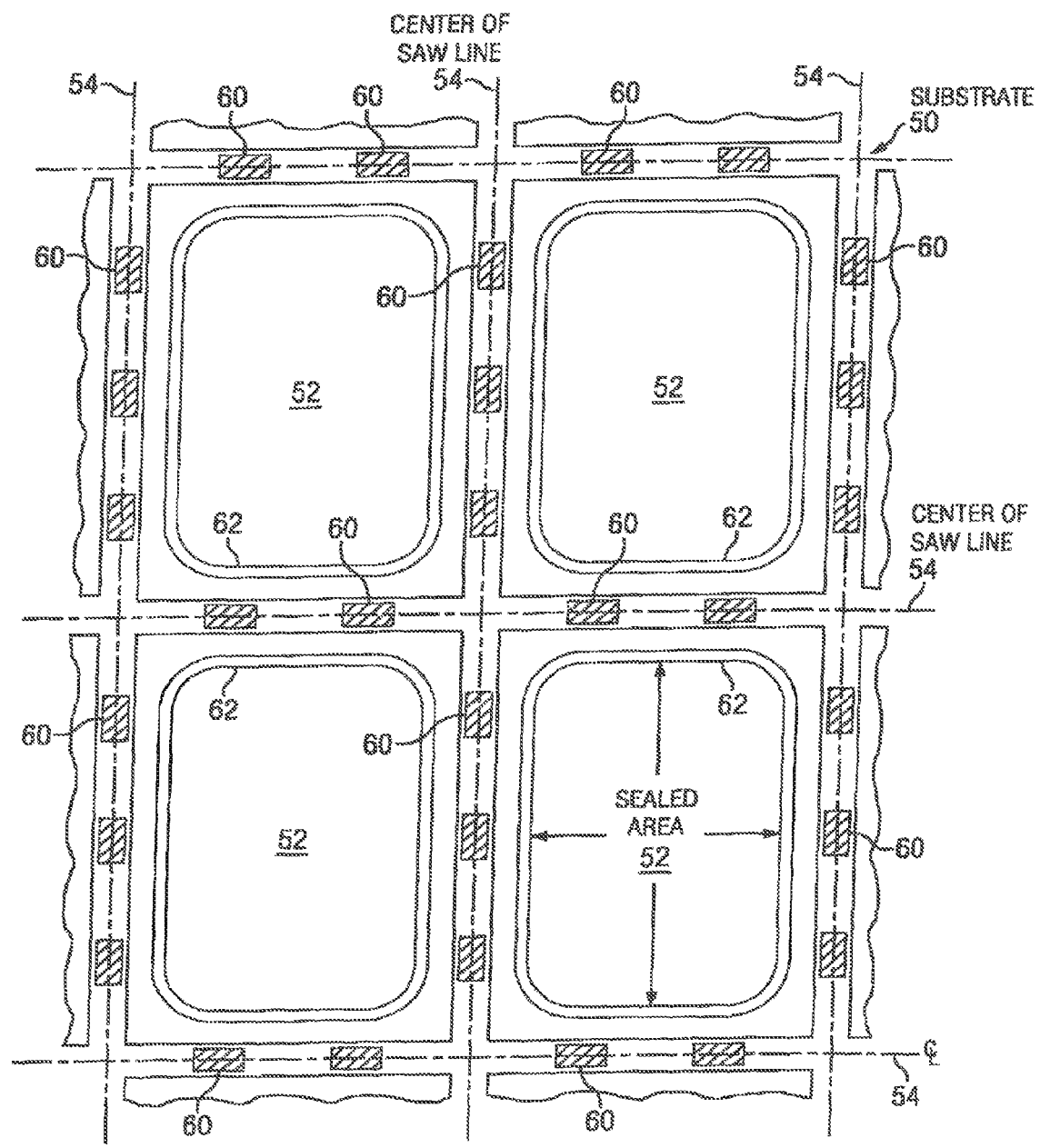
FIG.3 illustrates an example of BGCSs of a substrate.

FIG. 3 illustrates an example of BGCSs 60 of a substrate 50 of dies. In certain embodiments, substrate 50 has saw lines 54, scribe regions, and/or sealed areas 52. A saw line 54 indicates an area where a substrate is to be cut. The center of saw line 54 is indicated by a dotted line in FIG. 3. A scribe region is an area between semiconductor element forming regions. A sealed area may be under a vacuum and may protect certain devices. For example, seal ring may protect MEMS devices from the external environment.

In certain embodiments, one or more BGCSs 60 are disposed outwardly from substrate 50. A BGCS 60 may operate as a mechanical stop that controls the geometry of a bond line 62 of a seal ring. Bond line 62 is formed from joining material after bonding. The geometry of bond line 62 includes gap thickness and width. The gap refers to the gap between bonded substrates, and the gap thickness is measured in a direction that is perpendicular to the flat surface of a substrate 50. The width is measured along the flat surface of substrate 50.

Typically, applications call for more uniform bond line geometry. The uniformity, however, may be affected by the flatness of the substrates and the bond force used to flatten the substrates. A BGCS 60 may control the bond gaps, which may control bond widths, which may yield a more uniform bond line.

A BGCS 60 may have any suitable size and shape. For example, BGCS 60 may have a width in any of the following ranges 1 to 10, 10 to 50, 50 to 100, or over 100 micrometers ($\mu$m), a length in any of the following ranges 50 to 100, 100 to 200, or over 200 $\mu$m, and a thickness in any of the following ranges 1 to 5, 5 to 10, 10 to 20, or over 20 $\mu$m (where thickness is measured in a direction that is perpendicular to the flat surface of a substrate 50). In certain embodiments, if gap thickness x is desired, BGCS 60 with thickness x may be used. In other embodiments, the BGCS thickness may be thicker or thinner than x. A BGCS 60 may be a continuous line or an Island.

BGCS 60 may be placed on any suitable BGCS region of substrate 50. In certain embodiments, a BGCS region may be outside of an area that may be affected by BGCS 60, such as outside of a sealed area 52 that may be affected by outgassing of BGCS 60. In certain embodiments, a BGCS region may be within an area that does not include underlying circuitry, such as a scribe region. In certain embodiments, a BGCS region may be within an area that may be later removed, such as along saw lines 54 or dicing lanes.

Figure 4A:
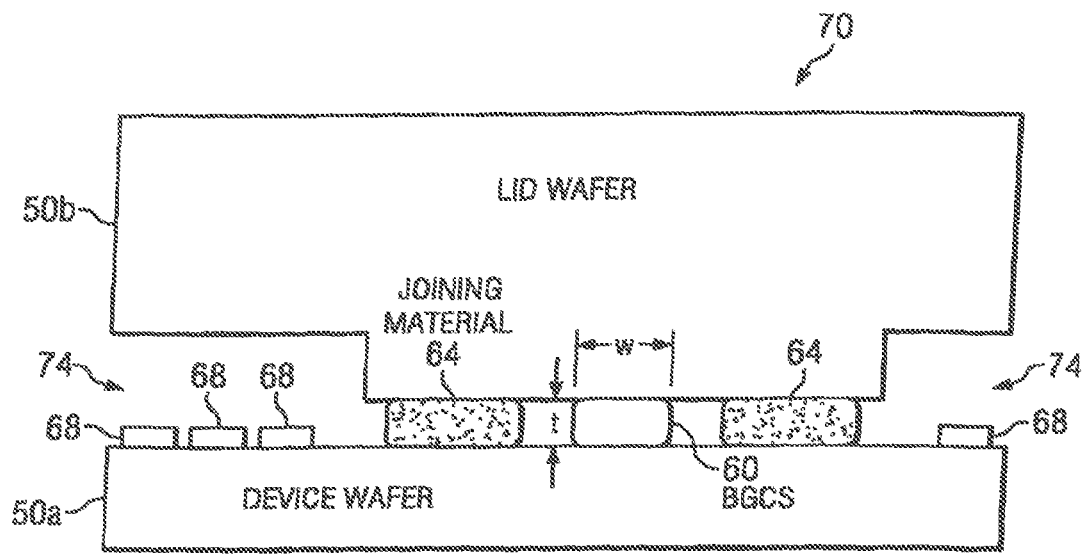
FIGS. 4A and 4B illustrate an example of structures formed using a disposable BGCS.
Figure 4B:
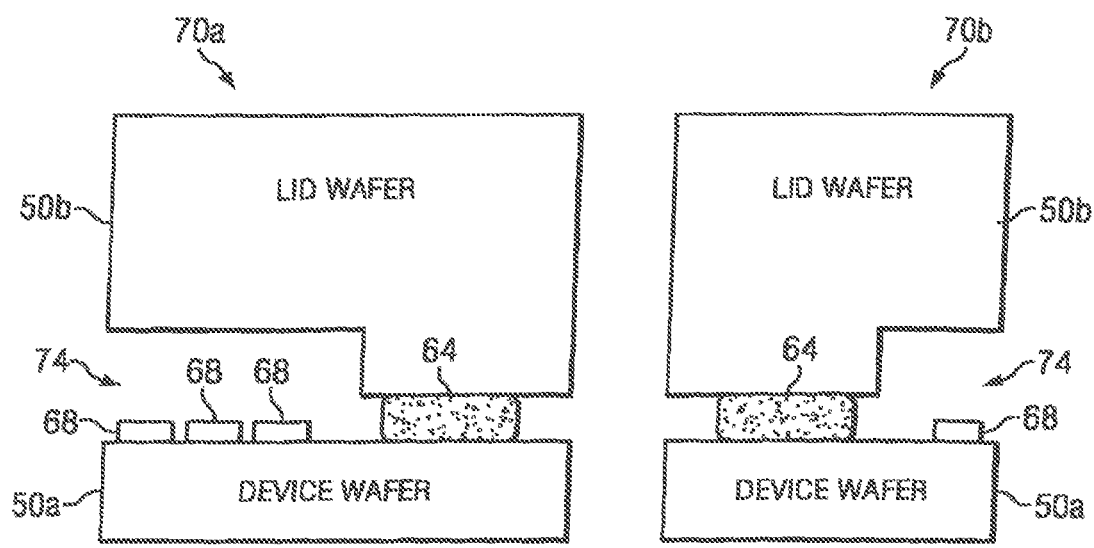

FIGS. 4A and 4B illustrate an example of structures 70a and 70b formed using a disposable BGCS 60. FIG. 4A illustrates a structure 70 that includes a first substrate comprising a device wafer 50a. BGCS 60, joining material 64, and MEMS structures 68 are disposed outwardly from device wafer 50a. A second substrate comprising a lid wafer 50b is disposed outwardly from BGCS 60, joining material 64, and MEMS structures 68, forming a sealed area 74. In the example, BGCS 60 has a width w and a thickness t and is placed along a saw line.

FIG. 4B illustrates structures 70a and 70b after cutting structure 70 along the saw line. Cutting separates structure 70 into structures 70a and 70b and also at least partially removes BGCS 60.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

A component of the systems and apparatuses disclosed herein may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more computers, one or more microprocessors, one or more applications, and/or other logic.

In particular embodiments, the operations of the embodiments may be performed by one or more computer readable media encoded with a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

A memory stores information. A memory may comprise one or more non-transitory, tangible, computer-readable, and/or computer-executable storage media. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A method to join first and second substrates comprising:
    disposing a bond gap control structure (BGCS) outwardly from the first substrate;
    configuring the BGCS to provide uniformity in a bond line of a joining material;
    disposing the joining material outwardly from the first substrate and/or a second substrate;
    bonding the first substrate to the second substrate with the joining material to yield a bonded structure including a sealed area defined by the joining material and the first and second substrates, wherein the entire BGCS is external to the sealed area; and
    at least partially removing the BGCS from the bonded structure.

2. The method of claim 1, the BGCS comprising an organic material.

3. The method of claim 1, the BGCS comprising an inorganic material.

4. The method of claim 1, the disposing the BGCS outwardly from the first substrate comprising:
    disposing the BGCS outside of a sealed area disposed outwardly from the first substrate.

5. The method of claim 2, the disposing the BGCS outwardly from the first substrate comprising:
    disposing the BGCS at a scribe region of the first substrate.

6. The method of claim 1, the disposing the BGCS outwardly from the first substrate comprising:
    disposing the BGCS at a saw line of the first substrate.

7. The method of claim 1, the disposing the BGCS outwardly from the first substrate comprising:
    jetting the BGCS outwardly from the first substrate.

8. The method of claim 1, the at least partially removing the BGCS from the bonded structure comprising:
    cutting the BGCS to at least partially remove the BGCS.

9. The method of claim 1, the at least partially removing the BGCS from the bonded structure comprising:
    jetting a liquid towards the BGCS to at least partially remove the BGCS.

10. The method of claim 1, wherein the sealed area has a vacuum.

11. The method of claim 1, wherein the BGCS provides uniformity in the bond line of the joining material when the first and/or second substrates are not flat.

12. The method of claim 1, wherein the BGCS and the joining material comprise different materials.

* * * * *